US008604504B2

(12) United States Patent
Sekine et al.

(10) Patent No.: US 8,604,504 B2
(45) Date of Patent: Dec. 10, 2013

(54) ORGANIC LIGHT-EMITTING ELEMENT

(75) Inventors: Koujirou Sekine, Ibaraki (JP); Mitsuru Yokoyama, Takatsuki (JP)

(73) Assignee: Konica Minolta Holdings, Inc., Tokyo (JP)

( * ) Notice: Subject to any disclaimer, the term of this patent is extended or adjusted under 35 U.S.C. 154(b) by 0 days.

(21) Appl. No.: 13/637,138

(22) PCT Filed: Mar. 1, 2011

(86) PCT No.: PCT/JP2011/054561
§ 371 (c)(1),
(2), (4) Date: Sep. 25, 2012

(87) PCT Pub. No.: WO2011/125390
PCT Pub. Date: Oct. 13, 2011

(65) Prior Publication Data
US 2013/0015486 A1 Jan. 17, 2013

(30) Foreign Application Priority Data
Apr. 2, 2010 (JP) ................................. 2010-086047

(51) Int. Cl.
*H01L 51/52* (2006.01)
(52) U.S. Cl.
USPC ............................................. 257/98; 257/40
(58) Field of Classification Search
CPC ........................................................ H01L 51/52
USPC ........................................ 257/98, 40, E51.019
See application file for complete search history.

(56) References Cited

U.S. PATENT DOCUMENTS

| 7,671,520 B2 | 3/2010 | Jagt et al. |
| 2004/0046497 A1 | 3/2004 | Schaepkens et al. |
| 2004/0195962 A1* | 10/2004 | Nakamura et al. ............ 313/504 |
| 2008/0043329 A1 | 2/2008 | Jagt et al. |
| 2011/0059305 A1 | 3/2011 | Kaneya et al. |

FOREIGN PATENT DOCUMENTS

| JP | 2931211 B2 | 8/1999 |
| JP | 2004-20746 A | 1/2004 |
| JP | 2005-537963 A | 12/2005 |
| JP | 2008-511854 A | 4/2008 |
| JP | 2011-82089 A | 4/2011 |
| WO | WO 2009/107429 A1 | 9/2009 |

OTHER PUBLICATIONS

Japanese Office Action mailed on Jul. 3, 2012 for corresponding Japanese Patent Application 2011-528705.

* cited by examiner

*Primary Examiner* — Walter H Swanson
(74) *Attorney, Agent, or Firm* — Brinks Gilson & Lione

(57) ABSTRACT

An organic light-emitting element including an organic light-emitting layer, a transparent substrate, and a transparent electrode disposed between the organic light-emitting layer and the transparent substrate; and which treats the surface of the transparent substrate on the opposite side from the transparent electrode as a light-extraction surface. The transparent substrate has birefringence, and has a refraction index of a P polarized light that is less than a refraction index of an S polarized light. A polarized light wherein an oscillation direction of an electric field is parallel to a laminated surface of the light-emitting layer is designated S polarized light, and a polarized light that includes a vector of the direction of the progression of the light and in which the oscillation direction of the electric field is included in a plane perpendicular to the laminated surface is designated P polarized light.

12 Claims, 7 Drawing Sheets

FIG.4

| | TRANSPARENT SUBSTRATE | | | S-POLARIZED LIGHT | P-POLARIZED LIGHT | |
|---|---|---|---|---|---|---|
| | | $n_e$ | $n_o$ | TE MODE (NO. OF MODES) | TM MODE (NO. OF MODES) | PLASMON MODE (NO. OF MODES) |
| EXAMPLE 1 | BIREFRINGENCE PROPERTY | 1.5 | 1.75 | 0 | 0 | 1 |
| EXAMPLE 2 | BIREFRINGENCE PROPERTY | 1.5 | 1.75/1.74 | 0 | 0 | 1 |
| COM. EXAMPLE 1 | ISOTROPY | 1.5 | 1.5 | 1 | 0 | 1 |
| COM. EXAMPLE 2 | ISOTROPY | 1.75 | 1.75 | 0 | 0 | 1 |

|  | 1.5 | 1.55 | 1.6 | 1.65 | 1.7 | 1.75 |
|---|---|---|---|---|---|---|
| S-POLARIZED LIGHT | 54.9% | 59.3% | 62.6% | 64.5% | 64.9% | 65.0% |
| P-POLARIZED LIGHT | 58.1% | 58.0% | 57.8% | 57.1% | 55.9% | 54.5% |
| TOTAL | 56.0% | 58.8% | 60.9% | 61.9% | 61.8% | 61.3% |

PRIOR ART

ORGANIC LIGHT-EMITTING ELEMENT

Applicants claim, under 35 U.S.C. §§120 and 365, the benefit of priority of the filing date of Mar. 1, 2011 of a Patent Cooperation Treaty patent application, copy attached, Serial Number PCT/JP2011/054561, filed on the aforementioned date, the entire contents of which are incorporated herein by reference, wherein Patent Cooperation Treaty patent application Serial Number PCT/JP2011/054561 was not published under PCT Article 21(2) in English.

Applicants claim, under 35 U.S.C. §119, the benefit of priority of the filing date of Apr. 2, 2010 of a Japanese patent application, copy attached, Serial Number 2010-086047, filed on the aforementioned date, the entire contents of which are incorporated herein by reference.

TECHNICAL FIELD

The present invention relates to an organic light-emitting element including an organic light-emitting layer, a transparent substrate, and a transparent electrode that is provided between the organic light-emitting layer and the transparent substrate, in which a surface of the transparent substrate on the opposite side to the transparent electrode is used as a light extraction surface.

BACKGROUND ART

Attention has currently been drawn to an organic light-emitting element as a thin-type light-emitting member. An organic light-emitting element can provide a high luminance using low power and is excellent in terms of visibility, a response speed, a service life, and power consumption. The light use efficiency thereof, however, is on the order of 20%, and hence there is a large loss in an organic light-emitting element.

FIG. 9 is a schematic sectional view of a conventional organic light-emitting element. An organic light-emitting element 100 is formed by stacking, in order from a lower layer in the figure, a metal electrode 101, an organic light-emitting layer 102, a transparent electrode 103, and a transparent substrate 104. In the figure, arrows 110a to 110e represent characteristic ones of light rays generated from the organic light-emitting layer 102.

The light ray 110a is a light ray in a perpendicular direction to the organic light-emitting layer 102 that is a light-emitting plane, which is transmitted through the transparent substrate 104 to be extracted to a light extraction side (air side). The light ray 110b is a light ray that has entered an interface between the transparent substrate 104 and the air at a shallow angle not more than a critical angle and is refracted at the interface between the transparent substrate 104 and the air to be extracted to the light extraction side. The light ray 110c is a light ray that has entered the interface between the transparent substrate 104 and the air at an angle deeper than the critical angle and is totally reflected off the interface between the transparent substrate 104 and the air, thus failing to be extracted to the light extraction side. A loss attributable to this is referred to as a substrate loss, and due thereto, there is typically a loss on the order of 20%.

The light ray 110d is a light ray satisfying a resonance condition among light rays that have entered an interface between the transparent electrode 103 and the transparent substrate 104 at an angle deeper than a critical angle. The light ray 110d is totally reflected off the interface between the transparent electrode 103 and the transparent substrate 104, which establishes a waveguide mode in which the light ray 110d is trapped inside the organic light-emitting layer 102 and the transparent electrode 103. A loss attributable to this is referred to as a waveguide loss, and due thereto, there is typically a loss on the order of 20 to 25%. The light ray 110e is a light ray that enters the metal electrode 101 to interact with a free electron in the metal electrode 101, which establishes a plasmon mode that is one form of the waveguide mode, in which the light ray 110e is trapped in the vicinity of a surface of the metal electrode 101. A loss attributable to this is referred to as a plasmon loss, and due thereto, there is typically a loss on the order of 30 to 40%.

As described above, in the conventional organic light-emitting element 100, there are a substrate loss, a waveguide loss, and a plasmon loss, and hence it has been sought to reduce these losses so as to extract a maximum possible amount of light.

For example, Patent Document 1 discloses an organic EL (electro luminescence) device in which a light scattering portion constituted by a lens sheet is provided on a light extraction surface side. Furthermore, Patent Document 2 discloses a substrate for a light-emitting device and a light-emitting device. The substrate for a light-emitting device disclosed therein is composed of a high refractive index convexo-concave layer having a refractive index of not less than 1.6 and an average surface roughness of not less than 10 nm, which is provided on a surface of the substrate at least on one side thereof, and one or more base material layers each having a refractive index of not less than 1.55, and is used on a light-emitting surface side of the light-emitting device.

LIST OF CITATIONS

Patent Literature

Patent Document 1: Publication of Japanese Patent No. 2931211
Patent Document 2: JP-A-2004-20746

SUMMARY OF THE INVENTION

Technical Problem

The techniques of Patent Documents 1 and 2 are both intended to reduce a substrate loss by changing the shape of an interface between a transparent substrate and the air so as to achieve an improvement in light use efficiency. Patent Documents 1 and 2, however, disclose no measures to reduce a waveguide loss and a plasmon loss. Thus, by reducing a waveguide loss and a plasmon loss, it is possible to achieve a further improvement in light use efficiency.

In view of the above, it is an object of the present invention to provide an organic light-emitting element that is reduced in waveguide loss and thus achieves an improvement in light use efficiency.

Solution to the Problem

In order to achieve the above-described object, the present invention provides an organic light-emitting element including: an organic light-emitting layer; a transparent substrate; and a transparent electrode that is provided between the organic light-emitting layer and the transparent substrate, in which a surface of the transparent substrate on the opposite side to the transparent electrode is used as a light extraction surface. In the organic light-emitting element, the transparent substrate has birefringence, and where polarized light having an electric field oscillation direction parallel to a stacking plane of the organic light-emitting layer is defined as S-polarized light, and polarized light having an electric field oscillation direction included in a plane that includes a vector in a travel direction of the light and is perpendicular to the stacking plane of the organic light-emitting layer is defined as P-polarized light, the refractive index of the transparent substrate for the P-polarized light is smaller than that of the transparent substrate for the S-polarized light.

Advantageous Effects of the Invention

According to the present invention, the transparent substrate has birefringence, and thus a waveguide loss can be reduced, so that an improvement in light use efficiency can be achieved.

BRIEF DESCRIPTION OF DRAWINGS

FIG. 4 A diagram in which respective features of Examples 1 and 2 and Comparative Examples 1 and 2 are summarized.

DESCRIPTION OF EMBODIMENTS

<Configuration of Organic Light-emitting Element>

Figure 1:
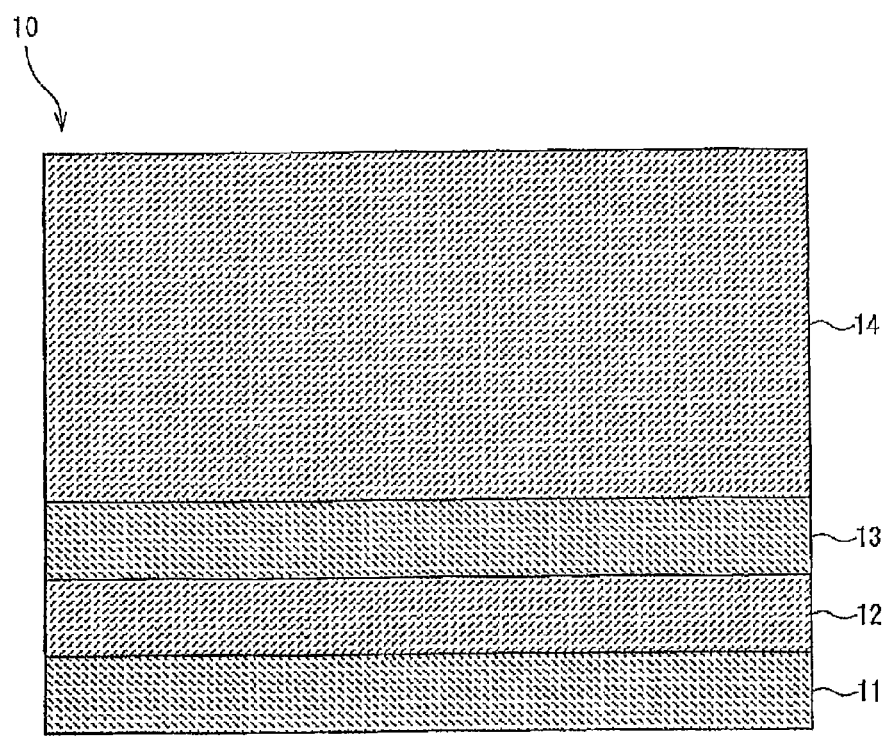
FIG. 1 A schematic sectional view of an organic light-emitting element in an embodiment of the present invention.
Figure 1:
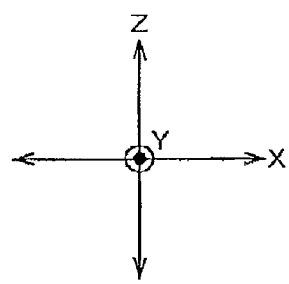

FIG. 1 is a schematic sectional view of an organic light-emitting element in an embodiment of the present invention. An organic light-emitting element 10 is formed by stacking, in order from a lower layer in the figure, a rear surface electrode 11, an organic light-emitting layer 12, a transparent electrode 13, and a transparent substrate 14. The organic light-emitting element 10 is of a bottom emission type in which a surface of the transparent substrate 14 on the opposite side to the transparent electrode 13 is used as a light extraction surface.

For the sake of convenience of explanation, in each figure, a lateral direction in the plane of the figure is defined as an X direction, a direction perpendicular to the plane of the figure as a Y direction, and a vertical direction in the plane of the figure (a stacking direction in which the respective layers are stacked) as a Z direction.

The rear surface electrode 11 acts as an anode or a cathode and also as a mirror that reflects light to the side of the transparent substrate 14, and as a material thereof, for example, a metal material having a reflectivity of not less than 60% such as aluminum, silver, nickel, titanium, sodium, or calcium or an alloy containing any of these materials can be used.

The organic light-emitting layer 12 is constituted by a single or multiple organic compound or complex layers including a luminous layer and is composed of, for example, a positive hole transport layer in contact with the anode, the luminous layer made of a luminous material, and an electron transport layer in contact with the cathode, and the thickness thereof is several nm to several hundreds of nm. The organic light-emitting layer 12 has a refractive index in the neighborhood of 1.8. Furthermore, in the organic light-emitting layer 12, a lithium fluoride layer, a layer of an inorganic metal salt, a layer containing lithium fluoride or an inorganic metal salt, or the like may be formed at an arbitrary position. The luminous layer is made of at least one type of luminous material, and as the luminous material, a fluorescent compound, a phosphorescent compound, or the like can be used.

As a configuration of the organic light-emitting layer 12, for example, any of configurations (i) to (v) below, which includes the above-described configuration, can be adopted.

(i) (anode)/luminous layer/electron transport layer/(cathode)

(ii) (anode)/positive hole transport layer/luminous layer/electron transport layer/(cathode)

(iii) (anode)/positive hole transport layer/luminous layer/positive hole blocking layer/electron transport layer/(cathode)

(iv) (anode)/positive hole transport layer/luminous layer/positive hole blocking layer/electron transport layer/electron injection layer/(cathode)

(v) (anode)/positive hole injection layer/positive hole transport layer/luminous layer/positive hole blocking layer/electron transport layer/electron injection layer/(cathode)

The positive hole transport layer is made of a material having a function of transporting a positive hole and subsumes, in a broader sense, the positive hole injection layer and the electron blocking layer. The positive hole transport layer can be provided in a single or multiple layers.

The electron transport layer is made of a material having a function of transporting an electron and subsumes, in a broader sense, the electron injection layer and the positive hole blocking layer. The electron transport layer can be provided in a single or multiple layers.

The positive hole blocking layer, in a broader sense, has the function of the electron transport layer and is made of a positive hole blocking material that, while having a function of transporting an electron, is significantly poor in capability of transporting a positive hole, thus blocking a positive hole while transporting an electron, so that the probability of recombination between an electron and a positive hole can be improved.

The positive hole injection layer and the electron injection layer are layers that are each provided between an electrode and a luminous layer so that a decrease in driving voltage and an improvement in emission luminance can be achieved.

The transparent electrode 13 is a counter electrode to the rear surface electrode 11, and as a material thereof, for example, an electrically conductive transparent material having a light transmittance of not less than 40% such as CuI, indium tin oxide (ITO), $SnO_2$, or ZnO can be used. The transparent electrode 13 has a refractive index in the neighborhood of 1.8, which is equal to that of the organic light-emitting layer 12.

The transparent substrate 14 is made of a transparent material having a birefringence and has a thickness of, for example, 0.1 to 1 mm. As will be described later, preferably, a birefringence property thereof is such that its refractive index for P-polarized light is smaller than that for S-polarized light. Furthermore, preferably, the transparent substrate 14 is uniaxial and has an optical axis perpendicular (Z direction) to the organic light-emitting layer 12 and to a stacking plane (X-Y plane) of the transparent substrate 14. In this case, the refractive index in the X direction is equal to that in the Y direction, and the refractive index in the Z direction is different from those in the X direction and in the Y direction. The transparent substrate 14 may be biaxial as long as its refractive index for P-polarized light is smaller than that for S-polarized light as described above. Preferably, the transparent substrate 14 has a refractive index in a range in the neighborhood of 1.5 to 1.8.

As a material of the transparent substrate 14, for example, resin such as polyethylene naphthalate (PEN), polyethylene terephthalate (PET), polycarbonate (PC), polystyrene (PS), or polyvinyl chloride (PVC), or crystal can be used. Preferably used is a resin film that can impart flexibility to the organic light-emitting element. Using a flexible film-shaped base material to form the transparent substrate 14 allows a planar light source to be curved and thus can achieve light emission toward different directions.

On the transparent substrate 14, the transparent electrode 13, the organic light-emitting layer 12, and the rear surface electrode 11 are stacked, and electrode portions are formed by exposing the transparent electrode 13 at one end and by exposing the rear surface electrode 11 at the other end and are connected to power source wiring lines (not shown) of a power source portion (not shown), respectively. Then, a predetermined direct current voltage is applied to the organic light-emitting layer 12 so as to cause light emission.

Since the organic compound used to form the organic light-emitting element 10 is subject to degradation due to moisture or oxygen in the air, preferably, the organic light-emitting element 10 is sealed with an anti-moisture permeability layer (gas barrier layer) so as to be used in a state shielded from the outside atmosphere. The anti-moisture permeability layer can be formed by, for example, a radio frequency sputtering method. Furthermore, on the transparent substrate 14, a hard coat layer, an undercoat layer, or the like may be provided as required.

<Method for Manufacturing Organic Light-emitting Element>

Next, as one example of a method for manufacturing the organic light-emitting element 10, the following describes a method for manufacturing an element having the following configuration: transparent substrate/anode/positive hole injection layer/positive hole transport layer/luminous layer/positive hole blocking layer/electron transport layer/electron injection layer/cathode.

First, on the transparent substrate 14, as the transparent electrode 13, a thin film of a material for an anode is formed in a thickness of not more than 1 μm, preferably, a thickness of 10 nm to 200 nm by a method such as vapor deposition or sputtering to prepare an anode.

Then, as the organic light-emitting layer 12, organic compound thin films such as the positive hole injection layer, the positive hole transport layer, the luminous layer, the positive hole blocking layer, the electron transport layer, the electron injection layer are formed thereon.

Usable methods for forming these layers include a vapor deposition method, a wet process (a spin coating method, a casting method, an ink jet method, a printing method), and the like, and from a viewpoint such as of easily obtaining a homogeneous film and hardly generating a pinhole, preferable is film formation by a coating method such as the spin coating method, the ink-jet method, or the printing method.

As a liquid medium in which the organic light-emitting layer 12 is dissolved or dispersed, for example, ketones such as methyl ethyl ketone and cyclohexanone, fatty esters such as ethyl acetate, halogenated hydrocarbons such as dichlorobenzene, aromatic hydrocarbons such as toluene, xylene, mesitylene, and cyclohexylbenzene, aliphatic hydrocarbons such as cyclohexane, decalin, and dodecane, and organic solvents such as DMF and DMSO can be used. Furthermore, as a dispersion method, a method using ultrasonic waves, high shearing force dispersion, media dispersion, or the like can be employed.

After the formation of these layers, as the rear surface electrode 11, a thin film of a material for a cathode is formed thereon in a thickness of not more than 1 μm, preferably, a thickness in a range of 50 nm to 200 nm by a method such as, for example, vapor deposition or sputtering to prepare a cathode. By the above-described processes, the organic light-emitting element 10 is obtained.

<Reduction of Loss>

In the organic light-emitting element 10, from the organic light-emitting layer 12, light rays are generated at different angles and in different polarized states. Herein, among such light rays, polarized light having an electric field oscillation direction parallel to a stacking plane (X-Y plane) of the organic light-emitting layer 12 is defined as S-polarized light, and polarized light having an electric field oscillation direction included in a plane (plane including a Z axis) that includes a vector in a travel direction of the light and is perpendicular to the stacking plane (X-Y plane) of the organic light-emitting layer 12 is defined as P-polarized light. Furthermore, an in-plane refractive index that is a refractive index parallel to the stacking plane (X-Y plane) of the transparent substrate 14 having birefringence is indicated as $n_o$, and a refractive index in a direction (Z direction) perpendicular to the stacking plane (X-Y plane) of the transparent substrate 14 is indicated as $n_e$.

Based on the above definitions, in a case where the transparent substrate 14 is a uniaxial transparent substrate having an optical axis in the Z direction, the refractive index that S-polarized light entering the transparent substrate 14 from the transparent electrode 13 experiences is $n_o$ in all directions. On the other hand, the refractive index that P-polarized light experiences is $n_e$ in a case where the P-polarized light travels in a direction parallel to the stacking plane (X-Y plane) while it is $n_o$ in a case where the P-polarized light travels in a direction (Z direction) perpendicular to the stacking plane (X-Y plane), and in a case where the P-polarized light travels in a direction at an angle lying between these directions, the refractive index has a value between $n_e$ and $n_o$.

Herein, for the sake of easier understanding of the effect provided by the transparent substrate 14 having a birefringence property, in the following description, a typical example representing the organic light-emitting element 10 is used as Example 1, and, for comparison with Example 1, examples using transparent substrates each having no birefringence property are used as Comparative Examples 1 and 2.

An organic light-emitting element 10 of Example 1 includes a rear surface electrode 11 that is a 100-nm-thick aluminum layer, an organic light-emitting layer 12 that is a 100-nm-thick layer of a material having a refractive index of 1.8, a transparent electrode 13 that is a 100-nm-thick layer of ITO having a refractive index of 1.8, and a transparent substrate 14 that is a 0.5-mm-thick layer of PEN where $n_e=1.5$ and $n_O=1.75$.

An organic light-emitting element of Comparative Example 1 is different from the organic light-emitting element 10 of Example 1 in that a transparent substrate included therein is a 0.5-mm-thick layer of alkali-free glass having a refractive index of 1.5, and except for this difference, the configuration thereof is the same as that of the organic light-emitting element 10 of Example 1. An organic light-emitting element of Comparative Example 2 is different from the organic light-emitting element 10 of Example 1 in that a transparent substrate included therein is a 0.5-mm-thick layer of glass having a refractive index of 1.75 (U-SF6M manufactured by Konica Minolta Holdings, Inc.), and except for this difference, the configuration thereof is the same as that of the organic light-emitting element 10 of Example 1. The transparent substrates used in Comparative Examples 1 and 2 are made of isotropic materials and thus exhibit no birefringence property.

First, the following examines S-polarized light in the organic light-emitting element 10 of Example 1. In Example 1, the refractive index of the transparent substrate 14 that S-polarized light experiences is $n_O=1.75$, and the transparent electrode 13 has a refractive index of 1.8, there being a refractive index difference of only 0.05 between them, which can be said to be small. For this reason, it is unlikely that S-polarized light entering the transparent substrate 14 from the transparent electrode 13 is totally reflected, meaning that the waveguide mode is unlikely to be established. This is supported by data shown in FIG. 2.

Figure 2:
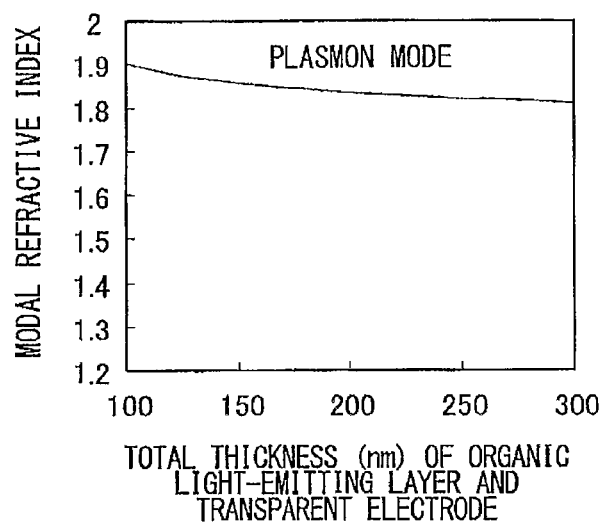
FIG. 2 A graph showing whether or not various modes exist in a case where, in an organic light-emitting element using a transparent electrode having a refractive index of 1.8 and a transparent substrate having a refractive index of 1.75, the total thickness of an organic light-emitting layer and the transparent electrode is made to vary.

FIG. 2 is a graph showing whether or not various modes exist in a case where, in an organic light-emitting element using a transparent electrode having a refractive index of 1.8 and a transparent substrate having a refractive index of 1.75, the total thickness of an organic light-emitting layer and the transparent electrode is made to vary. This organic light-emitting element corresponds to a case where, in the organic light-emitting element of Comparative Example 2, the total thickness of an organic light-emitting layer and a transparent electrode is changed to various thicknesses. Whether or not the various modes exist shown in FIG. 2, therefore, shows, as well as a case of Comparative Example 2, a case of S-polarized light in Example 1. It also shows a case of part of P-polarized light in Example 1 (a light ray among rays of P-polarized light, which is in the direction (Z direction) perpendicular to the stacking plane (X-Y plane)).

As shown in FIG. 2, in a case where the organic light-emitting layer and the transparent electrode fall into a typical total thickness range (100 to 300 nm) used in this measurement, there only exists the plasmon mode, and a TE mode and a TM mode do not exist. The TE (transverse electric) mode corresponds to, among light rays in the waveguide mode, a light ray having an electric field component transverse to an incidence plane, namely, S-polarized light. Furthermore, the TM (transverse magnetic) mode corresponds to, among light rays in the waveguide mode, a light ray having a magnetic field component transverse to the incidence plane, namely, P-polarized light.

Based on the above, as for S-polarized light in Example 1, as FIG. 2 shows that the TE mode does not exist in a case where the total thickness of the organic light-emitting layer 12 and the transparent electrode 13 is 200 nm, there exists no waveguide mode. Furthermore, the plasmon mode is a phenomenon that is not established for S-polarized light but is established for P-polarized light. Thus, light rays that exist with regard to S-polarized light in Example 1 correspond to the light rays 110a, 110b, and 110c in FIG. 9.

Next, the following examines P-polarized light in the organic light-emitting element 10 of Example 1. In Example 1, the refractive index of the transparent substrate 14 that P-polarized light experiences varies between 1.5 to 1.75 depending on a traveling direction thereof, and the transparent electrode 13 has a refractive index of 1.8. There is a refractive index difference of 0.05 to 0.3 between them, and as the difference approximates to 0.3, it becomes more likely that P-polarized light entering the transparent substrate 14 from the transparent electrode 13 is totally reflected, meaning that the waveguide mode is likely to be established.

Figure 3:
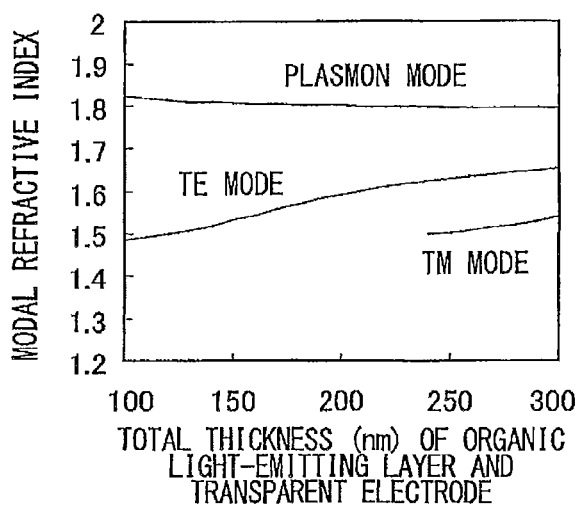
FIG. 3 A graph showing whether or not the various modes exist in a case where, in an organic light-emitting element using a transparent electrode having a refractive index of 1.8 and a transparent substrate having a refractive index of 1.5, the total thickness of an organic light-emitting layer and the transparent electrode is made to vary.

FIG. 3 is a graph showing whether or not the various modes exist in a case where, in an organic light-emitting element using a transparent electrode having a refractive index of 1.8 and a transparent substrate having a refractive index of 1.5, the total thickness of an organic light-emitting layer and the transparent electrode is made to vary. This organic light-emitting element corresponds to a case where, in the organic light-emitting element of Comparative Example 1, the total thickness of an organic light-emitting layer and a transparent electrode is changed to various thicknesses. Whether or not the various modes exist shown in FIG. 3, therefore, shows, as well as a case of Comparative Example 1, a case of part of P-polarized light in Example 1 (a light ray among rays of P-polarized light, which travels in a direction parallel to the stacking plane (XY plane)).

As shown in FIG. 3, in a case where the organic light-emitting layer and the transparent electrode fall into a typical total thickness range (100 to 300 nm) used in this measurement, the plasmon mode and the TE mode exist with respect to all thicknesses in the total thickness range, and the TM mode exists with respect to a total thickness of not less than about 240 nm.

Based on the above, as for P-polarized light in Example 1, as FIGS. 2 and 3 show that the TM mode does not exist in a case where the total thickness of the organic light-emitting layer 12 and the transparent electrode 13 is 200 nm, there exists no waveguide mode. Furthermore, the plasmon mode is a phenomenon that is established for P-polarized light and thus does exist in this case. Thus, light rays that exist with regard to P-polarized light in Example 1 correspond to the light rays 110a, 110b, 110c, and 110e.

Next, the following examines Comparative Example 1. FIG. 3 applies to both of S-polarized light and P-polarized light in Comparative Example 1, and referring thereto, with respect to a total thickness of the organic light-emitting layer and the transparent electrode of 200 nm, the TE mode exists, with no existence of the TM mode, and the plasmon mode also exists. There, therefore, exist one waveguide mode with regard to S-polarized light and one plasmon mode with regard to P-polarized light. Thus, Comparative Example 1 is different from Example 1 in that there exists therein the waveguide mode with regard to S-polarized light.

Next, the following examines Comparative Example 2. FIG. 2 applies to both of S-polarized light and P-polarized light in Comparative Example 2, and referring thereto, with respect to a total thickness of the organic light-emitting layer and the transparent electrode of 200 nm, the TE mode and the TM mode do not exit, and the plasmon mode exits. In Comparative Example 2, similarly to Example 1, there, therefore, exists no waveguide mode with respect to S-polarized light, and there exits one plasmon mode with regard to P-polarized light. In FIG. 4, respective features of Example 1 and Comparative Examples 1 and 2 are summarized.

The above-described results of Example 1 and Comparative Examples 1 and 2 show that, as for S-polarized light, the configuration of Comparative Example 1 is not preferable since the undesired TE mode exits therein, and the configuration of Example 1 or the configuration of Comparative Example 2 is preferable since a waveguide loss can be reduced therein.

As for P-polarized light, on the other hand, both in Example 1 and Comparative Example 2, the plasmon mode is established and might lead to a deterioration in use efficiency. This, however, depends on a relationship between the organic light-emitting layer and the rear surface electrode and has nothing to do with the transparent substrate 14. In view of this, in Example 1 and Comparative Example 2, when it is sought to extract light rays that have entered the transparent substrate to an air side (light extraction side) in the most effective way, preferably, total reflection conditions in the transparent substrate and in the air are relaxed as much as possible. In Example 1, the refractive index of the transparent substrate 14 for P-polarized light is 1.5 to 1.75, while in Comparative Example 2, the refractive index of the transparent substrate for P-polarized light is 1.75. With respect to the air having a refractive index of 1, the refractive index difference from the air in Example 1 is smaller than that in Comparative Example 2, and thus the total reflection conditions in the transparent substrate 14 and in the air are more relaxed in Example 1 than in Comparative Example 2. Consequently, as for P-polarized light, the configuration of Example 1 is more preferable than that of Comparative Example 2 since it can reduce a substrate loss.

When the use efficiency of S-polarized light and that of P-polarized light are considered comprehensively, it can be said that the light use efficiency in Example 1 is higher than that in each of Comparative Examples 1 and 2 and thus Example 1 is most preferable. Based on the above-described results, the most preferable configuration of the transparent substrate 14 is such that the transparent substrate 14 has a birefringence property ($n_e$, $n_o$), the refractive index for P-polarized light is smaller than that for S-polarized light, $n_o$ approximates to the refractive index of the transparent electrode 13, and $n_e$ is smaller than the refractive index of the transparent electrode 13. In other words, a preferable configuration of the transparent substrate 14 is such that the transparent substrate 14 has a birefringence property, the refractive index for P-polarized light is smaller than that for S-polarized light, as a condition advantageous to S-polarized light, the refractive index for S-polarized light is substantially equal to the refractive index of the transparent electrode 13, and as a condition advantageous to P-polarized light, the refractive index for P-polarized light is smaller than the refractive index of the transparent electrode 13.

There may be used a biaxial transparent substrate in which one of optical axes thereof is perpendicular (Z direction) to a stacking plane (X-Y plane) while the other is parallel to the stacking plane (X-Y plane). In this case, the refractive index that S-polarized light entering the transparent substrate from the transparent electrode experiences is $n_{o1}$ in the X direction and $n_{o2}$ in the Y direction. On the other hand, the refractive index that P-polarized light experiences is $n_e$ in a case where the P-polarized light travels in a direction parallel to the stacking plane (X-Y plane) while it is $n_o$ in a case where the P-polarized light travels in a direction (Z direction) perpendicular to the stacking plane (X-Y plane), and in a case where the P-polarized light travels in a direction at an angle lying between these directions, the refractive index has a value between $n_e$ and $n_o$. A possible example of a material of the transparent substrate is PEN with $n_e$=1.5, $n_{o1}$=1.75, and $n_{o2}$=1.74.

As Example 2, an organic light-emitting element is used that is different from the organic light-emitting element 10 of Example 1 in that a transparent substrate included therein is a 5-mm-thick layer of PEN with $n_e$=1.5, $n_{o1}$=1.75, and $n_{o2}$=1.74, and except for this difference, has the same configuration as that of the organic light-emitting element 10 of Example 1. This configuration also provides a similar effect to that obtained in Example 1.

<Further Reduction of Substrate Loss>

Figure 5:
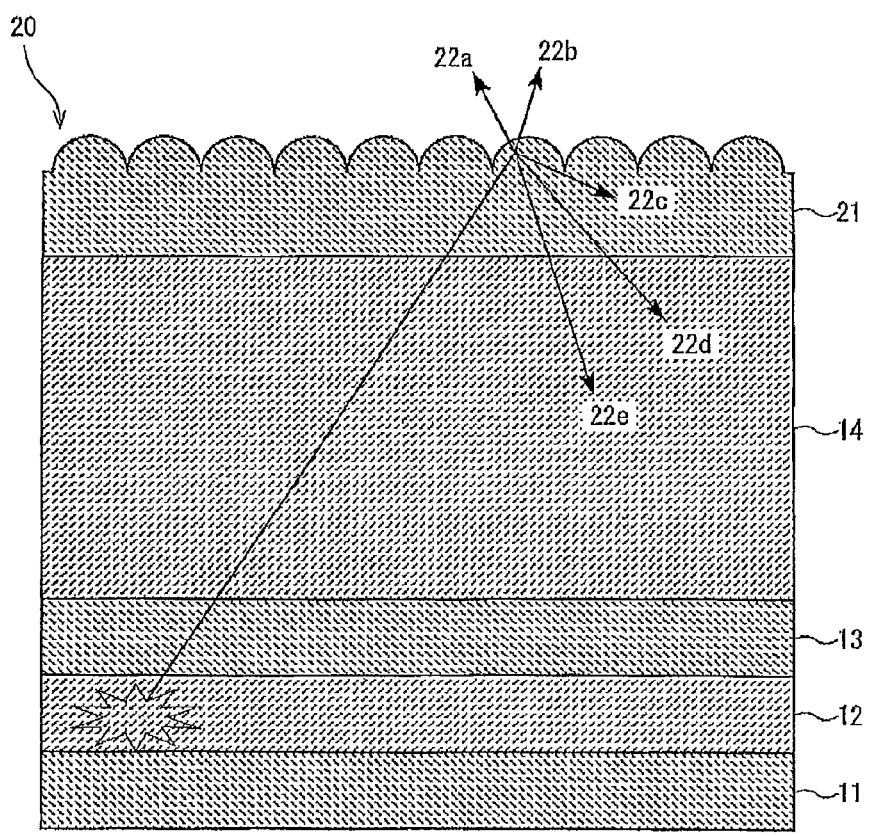
FIG. 5 A schematic sectional view of an organic light-emitting element in another embodiment of the present invention.

Next, a description is given of a technique for further reducing a substrate loss in the above-described organic light-emitting element 10. FIG. 5 is a schematic sectional view of an organic light-emitting element in another embodiment of the present invention. In an organic light-emitting element 20 shown therein, in addition to the configuration of the organic-light emitting element 10 in FIG. 1, a light angle changing element 21 further is provided on a light extraction surface side of a transparent substrate 14.

The light angle changing element 21 is only required to have a concavo-convex surface on a light extraction side, and as a concavo-convex shape thereof, for example, the shape of a microlens, a truncated prism, a circular cone, a pyramid, a truncated circular cone, a truncated pyramid, a random concave or convex, or the like can be adopted.

Figure 9:
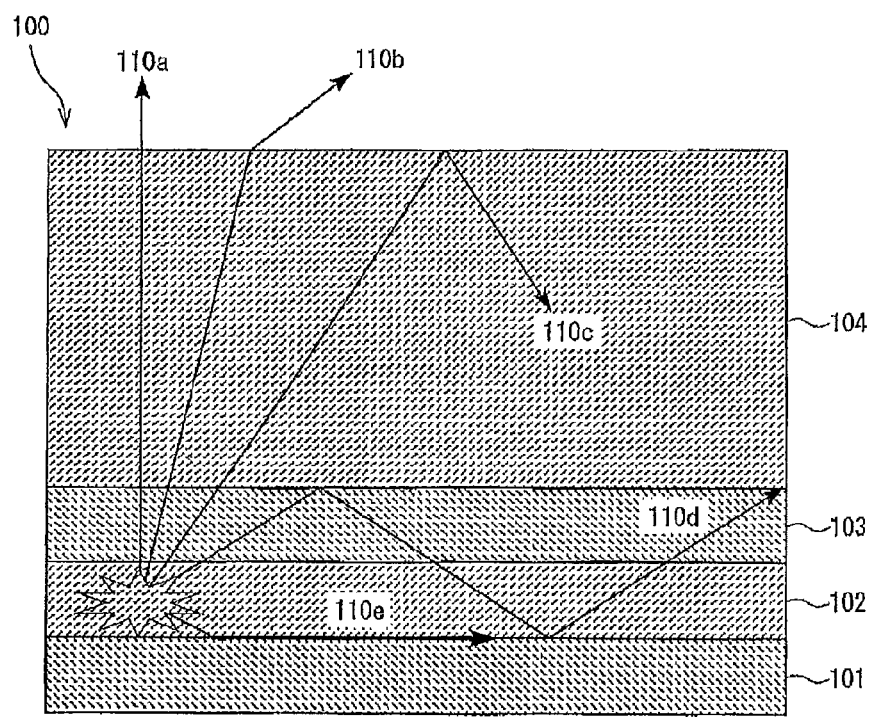

By this configuration, the light ray 110c shown in FIG. 9, which is supposed to be totally reflected off the interface between the transparent substrate and the air, thus failing to be extracted to the light extraction side, enters the light angle changing element 21, and its angle of travel is changed on the concavo-convex surface thereof, such that it is be extracted as light rays 22a and 22b, or it is reflected therein at angles different from the reflection angle of the light ray 110e to become light rays 22c to 22e, which then reenter the light angle changing element 21 to be extracted.

From the viewpoint of suppressing Fresnel reflection and total reflection at a boundary with the transparent substrate 14, most preferably, the light angle changing element 21 has a birefringence index equal in value to that of the transparent substrate 14. Due to manufacturing constraints, however, there may be a case where the light angle changing element 21 cannot be formed so as to have a birefringence property while maintaining an optical axis, in which case an isotropic material is used.

Figures 6, 7:
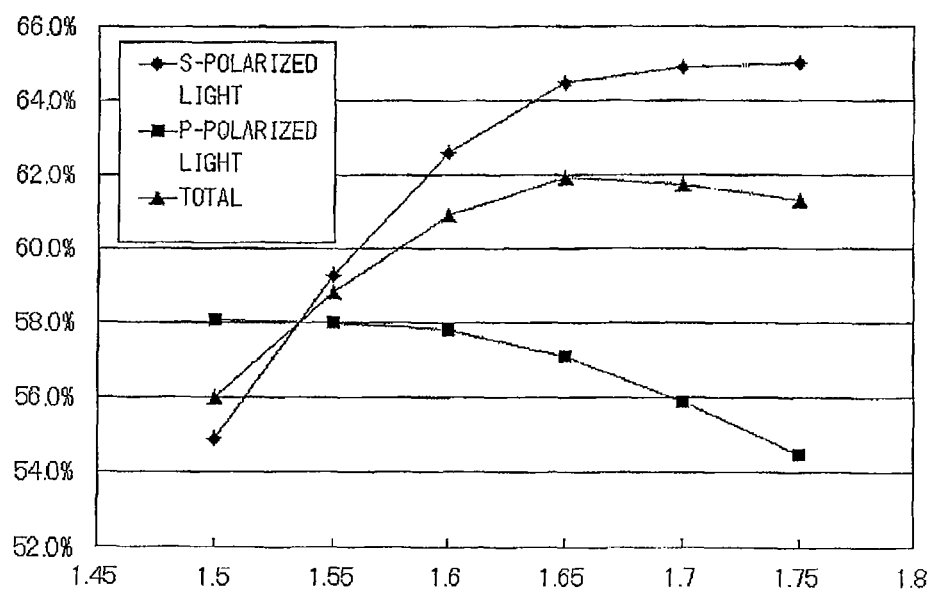
FIG. 6 A diagram showing values of light extraction efficiency of S-polarized light, P-polarized light, and a total of the S-polarized light and the P-polarized light in a case where an organic light-emitting element of Example 1 is provided with a light angle changing element made of each of isotropic materials varying in refractive index.
FIG. 7 A diagram in which the values shown in FIG. 6 are plotted in the form of a graph.

In the case where an isotropic material is used, resulting light extraction efficiency varies depending on a refractive index thereof selected. FIG. 6 shows values of light extraction efficiency of S-polarized light, P-polarized light, and a total of the S-polarized light and the P-polarized light in a case where the organic light-emitting element 10 of Example 1 is provided with, as the light angle changing element 21, a light angle changing element made of each of isotropic materials varying in refractive index, and FIG. 7 is a diagram in which the values shown in FIG. 6 are plotted in the form of a graph. It is herein assumed that the ratio between S-polarized light and P-polarized light that enter the light angle changing element 21 is 65%:35%.

FIGS. 6 and 7 show that the extraction efficiency of S-polarized light with respect to a refractive index of 1.75 is higher than that with respect to a refractive index of 1.5, and that the extraction efficiency of P-polarized light with respect to a refractive index of 1.5 is higher than that with respect to a refractive index of 1.75. Thus, in order to obtain increased light extraction efficiency of a total of the S-polarized light and the P-polarized light, in consideration also of the ratio between the S-polarized light and the P-polarized light, desirably, the light angle changing element 21 has a refractive index in a range of 1.5 to 1.75, i.e. between the birefringence indices of the transparent substrate 14. In a case where the transparent substrate 14 is uniaxial, desirably, the light angle changing element 21 has a refractive index between the refractive index of the transparent substrate 14 for P-polarized light and the refractive index of the transparent substrate 14 for S-polarized light, and in a case of a biaxial transparent substrate, desirably, the light angle changing element has a refractive index between the refractive index of the transparent substrate for P-polarized light and a smaller one of two refractive indices of the transparent substrate for S-polarized light. In an example shown in FIGS. 6 and 7, when the light angle changing element 21 has a refractive index of 1.65, the highest light extraction efficiency is obtained.

Figure 8:
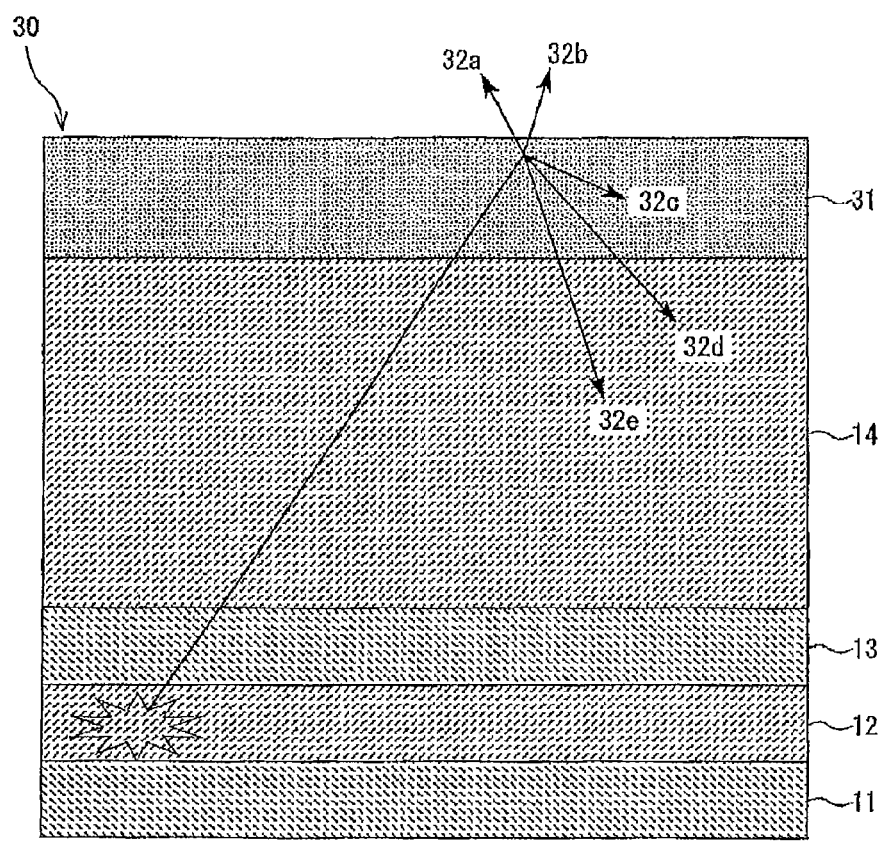
FIG. 8 A schematic sectional view of an organic light-emitting element in still another embodiment of the present invention FIG. 9 A schematic sectional view of a conventional organic light-emitting element.

A possible another example of the light angle changing element has a scattering layer. As long as the scattering layer is provided, any other layer(s) may also be included. FIG. 8 is a schematic sectional view of an organic light-emitting element in still another embodiment of the present invention. In an organic light-emitting element 30 shown therein, in addition to the configuration of the organic light-emitting element 10 in FIG. 1, as the light angle changing element, a scattering layer 31 further is provided on a light extraction surface side of a transparent substrate 14.

The scattering layer 31 can be made of, for example, a transparent resin as a base material in which microspheres of alumina or silica having a diameter on the order of 1 μm are dispersed. By this configuration, the light ray 110*c* shown in FIG. 9, which is supposed to be totally reflected off the interface between the transparent substrate and the air, thus failing to be extracted to the light extraction side, enters the scattering layer 31, and its angle of travel is changed therein such that it is extracted as light rays 32*a* and 32*b*, or its angle of travel is changed therein such that it becomes light rays 32*c* to 32*e*, which then reenter the scattering layer 31 to be extracted.

From the viewpoint of suppressing Fresnel reflection and total reflection at a boundary with the transparent substrate 14, most preferably, as the base material of the scattering layer 31, the same material as that of the transparent substrate 14 or a material having a birefringence index equal in value to that of the transparent substrate 14 is used. Furthermore, in a case where an isotropic material is used, similarly to the above-described light angle changing element 21, in order to obtain increased light extraction efficiency, desirably, the scattering layer 31 has a refractive index between the birefringence indices of the transparent substrate 14.

The light angle changing element may be configured to have both a concavo-convex surface and a scattering layer. For example, a configuration is possible in which the scattering layer 31 has a concavo-convex surface as shown in FIG. 5.

INDUSTRIAL APPLICABILITY

The organic light-emitting element of the present invention is applicable to display devices, displays, and various types of light-emitting light sources. Examples of light-emitting light sources include light sources for an illumination device (home illumination, in-vehicle illumination), a backlight for a watch or liquid crystal, billboard advertising, a traffic signal, and an optical storage medium, a light source for an electrophotographic copier, a light source for an optical communication processor, and a light source for a photo-sensor, though there is no limitation thereto. The organic light-emitting element of the present invention is effectively usable particularly as a backlight for a liquid crystal display device or a light source for illumination.

LIST OF REFERENCE SYMBOLS 10, 20, 30 organic light-emitting element
12 organic light-emitting layer
13 transparent electrode
14 transparent substrate
21 light angle changing element
31 scattering layer

The invention claimed is:
1. An organic light-emitting element, comprising:
an organic light-emitting layer;
a transparent substrate; and
a transparent electrode that is provided between the organic light-emitting layer and the transparent substrate;
a surface of the transparent substrate on an opposite side to the transparent electrode being used as a light extraction surface,
wherein
the transparent substrate has birefringence; and
where a polarized light having an electric field oscillation direction parallel to a stacking plane of the organic light-emitting layer is defined as S-polarized light, and a polarized light having an electric field oscillation direction included in a plane that includes a vector in a travel direction of the light and is perpendicular to the stacking plane of the organic light-emitting layer is defined as P-polarized light;
the transparent substrate is uniaxial and has an optical axis perpendicular to the stacking plane, and
a refractive index of the transparent substrate for the P-polarized light is smaller than a refractive index of the transparent substrate for the S-polarized light.

2. The organic light-emitting element according to claim 1, wherein
the refractive index of the transparent substrate for the P-polarized light is smaller than a refractive index of the transparent electrode.

3. An organic light-emitting element, comprising:
an organic light-emitting layer;
a transparent substrate; and
a transparent electrode that is provided between the organic light-emitting layer and the transparent substrate;
a surface of the transparent substrate on an opposite side to the transparent electrode being used as a light extraction surface,
wherein
the transparent substrate has birefringence; and
where a polarized light having an electric field oscillation direction parallel to a stacking plane of the organic light-emitting layer is defined as S-polarized light, and a polarized light having an electric field oscillation direction included in a plane that includes a vector in a travel direction of the light and is perpendicular to the stacking plane of the organic light-emitting layer is defined as P-polarized light;
the transparent substrate is biaxial, and one of two optical axes of the transparent substrate is perpendicular to the stacking plane while the other is parallel to the stacking plane, and
a refractive index of the transparent substrate for the P-polarized light is smaller than two refractive indices of the transparent substrate for the S-polarized light.

4. The organic light-emitting element according to claim 3, wherein
the refractive index of the transparent substrate for the P-polarized light is smaller than a refractive index of the transparent electrode.

5. An organic light-emitting element, comprising:
an organic light-emitting layer;
a transparent substrate; and
a transparent electrode that is provided between the organic light-emitting layer and the transparent substrate;
a surface of the transparent substrate on an opposite side to the transparent electrode being used as a light extraction surface,
wherein
the transparent substrate has birefringence; and
where a polarized light having an electric field oscillation direction parallel to a stacking plane of the organic light-emitting layer is defined as S-polarized light, and a polarized light having an electric field oscillation direction included in a plane that includes a vector in a travel direction of the light and is perpendicular to the stacking plane of the organic light-emitting layer is defined as P-polarized light,
a refractive index of the transparent substrate for the P-polarized light is smaller than a refractive index of the transparent substrate for the S-polarized light, and
the refractive index of the transparent substrate for the S-polarized light is substantially equal to a refractive index of the transparent electrode.

6. The organic light-emitting element according to claim 5, wherein
the refractive index of the transparent substrate for the P-polarized light is smaller than the refractive index of the transparent electrode.

7. An organic light-emitting element, comprising:
an organic light-emitting layer;
a transparent substrate; and
a transparent electrode that is provided between the organic light-emitting layer and the transparent substrate;
a surface of the transparent substrate on an opposite side to the transparent electrode being used as a light extraction surface,
wherein
the transparent substrate has birefringence; and
where a polarized light having an electric field oscillation direction parallel to a stacking plane of the organic light-emitting layer is defined as S-polarized light, and a polarized light having an electric field oscillation direction included in a plane that includes a vector in a travel direction of the light and is perpendicular to the stacking plane of the organic light-emitting layer is defined as P-polarized light,
a refractive index of the transparent substrate for the P-polarized light is smaller than a refractive index of the transparent substrate for the S-polarized light, and
the transparent substrate is made of polyethylene naphthalate, polyethylene terephthalate, polycarbonate, polystyrene, polyvinyl chloride, or crystal.

8. The organic light-emitting element according to claim 7, wherein
the refractive index of the transparent substrate for the P-polarized light is smaller than a refractive index of the transparent electrode.

9. An organic light-emitting element, comprising:
an organic light-emitting layer;
a transparent substrate; and
a transparent electrode that is provided between the organic light-emitting layer and the transparent substrate;
a surface of the transparent substrate on an opposite side to the transparent electrode being used as a light extraction surface,
wherein
the transparent substrate has birefringence; and
where a polarized light having an electric field oscillation direction parallel to a stacking plane of the organic light-emitting layer is defined as S-polarized light, and a polarized light having an electric field oscillation direction included in a plane that includes a vector in a travel direction of the light and is perpendicular to the stacking plane of the organic light-emitting layer is defined as P-polarized light,
a refractive index of the transparent substrate for the P-polarized light is smaller than a refractive index of the transparent substrate for the S-polarized light,
a light angle changing element is provided on a side of the light extraction surface of the transparent substrate, and
the light angle changing element has a refractive index between the refractive index of the transparent substrate for the P-polarized light and the refractive index of the transparent substrate for the S-polarized light.

10. The organic light-emitting element according to claim 9, wherein
the light angle changing element has a concavo-convex surface.

11. The organic light-emitting element according to claim 9, wherein
the light angle changing element has a scattering layer.

12. The organic light-emitting element according to claim 9, wherein
the refractive index of the transparent substrate for the P-polarized light is smaller than a refractive index of the transparent electrode.

* * * * *